US011575374B2

(12) United States Patent
Boulestin

(10) Patent No.: US 11,575,374 B2
(45) Date of Patent: Feb. 7, 2023

(54) DEVICE AND METHOD FOR PROVISION OF AN ADJUSTABLE CURRENT

(71) Applicant: STMicroelectronics (Grenoble 2) SAS, Grenoble (FR)

(72) Inventor: Renald Boulestin, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 103 days.

(21) Appl. No.: 16/867,333

(22) Filed: May 5, 2020

(65) Prior Publication Data
US 2020/0373922 A1 Nov. 26, 2020

(30) Foreign Application Priority Data
May 24, 2019 (FR) ...................................... 1905517

(51) Int. Cl.
*H03K 17/68* (2006.01)
*H03K 17/687* (2006.01)
(52) U.S. Cl.
CPC ........... *H03K 17/68* (2013.01); *H03K 17/687* (2013.01)
(58) Field of Classification Search
None
See application file for complete search history.

(56) References Cited

U.S. PATENT DOCUMENTS

| 6,577,181 B2* | 6/2003 | Takahashi | H03L 7/085 327/538 |
| 2017/0038784 A1 | 2/2017 | Rahman et al. | |
| 2019/0006019 A1* | 1/2019 | Wang | G11C 29/028 |

FOREIGN PATENT DOCUMENTS

| EP | 0930716 A2 | 7/1999 |
| JP | 2010199770 A | 9/2010 |

OTHER PUBLICATIONS

Albert Comerma, "Advanced Analog Building Blocks Current mirrors Introduction Basic current mirrors Comparison Other Enhanced current mirrors some considerations," Jan. 1, 2017, XP055666392.

* cited by examiner

*Primary Examiner* — Cassandra F Cox
(74) *Attorney, Agent, or Firm* — Slater Matsil, LLP

(57) ABSTRACT

The present disclosure concerns a device for supplying an adjustable current configured to supply discrete values of the current belonging to different current ranges, with a pitch between two successive discrete values determined by that of said ranges to which each of the two successive discrete values belongs.

20 Claims, 4 Drawing Sheets

DEVICE AND METHOD FOR PROVISION OF AN ADJUSTABLE CURRENT

CROSS-REFERENCE TO RELATED APPLICATIONS

This application claims priority to French Application No. FR 1905517, filed on May 24, 2019, the content of which is hereby incorporated herein by reference in its entirety to the maximum extent allowable by law.

TECHNICAL FIELD

The present disclosure generally concerns electronic circuits and, more specifically, devices for supplying an adjustable current.

BACKGROUND

Electronic circuits having their operation depending on the value of a current that they receive are known. Such circuits are designed so that, when the current that they receive is at a target value, they operate in correct or expected fashion, for example by respecting one or a plurality of pre-established constraints.

However, due to manufacturing variances, it is possible for the circuits not to operate as expected, even though the current that they receive is at the target value.

SUMMARY

There is a need for an adjustable current supply device so that, by adapting with respect to a target value the value of the current received by circuits having their operation depending on this current, the circuits can operate as expected.

An embodiment overcomes all or part of the disadvantages of known adjustable current supply devices.

An embodiment provides a device for supplying an adjustable current configured to supply discrete values of the current belonging to different current ranges, with a pitch between two successive discrete values determined by that of said ranges to which each of the two successive discrete values belongs.

According to an embodiment, the pitch separating two successive discrete values is different for each of said ranges.

According to an embodiment, at least one of said ranges, preferably each of said ranges, comprises at least three of said discrete values.

According to an embodiment, the device comprises:
a first source of a first current at a first node, configured to supply a different value of the first current for each of the ranges; and
a second current source configured to supply, at least from the first current and a digital control signal, the discrete values of the adjustable current to a second node.

According to an embodiment, a value of said pitch is determined by the value of the first current.

According to an embodiment, the first source comprises:
a third source of a second current connected to the first node; and
at least one series association of a fourth source of a third current and of a first switch having its off or on state determined by the digital control signal, said fourth source being configured to supply the third current to the first node when the first switch is on.

According to an embodiment:
the third source is a current mirror comprising a first transistor connected to the first node and mirror-assembled with a second transistor; and
the fourth source is a current mirror comprising a third transistor coupled to the first node and mirror-assembled with the second transistor.

According to an embodiment, the second current source comprises:
a fifth source of a fourth current configured to supply the fourth current to the second node;
at least one series association of a second switch having its off or on state determined by the digital control signal and of a sixth source of a fifth current configured to supply the fifth current to the second node when the second switch is on; and
a plurality of assemblies, each comprising a seventh source of a sixth current in series with a third switch, each assembly being configured to supply said sixth current to the second node when said second switch is on, the sixth current being different for each assembly and the off or on state of each third switch being determined by the digital control signal.

According to an embodiment:
the fifth current source comprises a fourth transistor mirror-assembled with the second transistor and a current mirror comprising a fifth transistor connected to the second node and mirror-assembled with a sixth transistor in series with the fourth transistor; and
the sixth source comprises a seventh transistor mirror-assembled with the sixth transistor and in series with the second switch.

According to an embodiment, in each of said assemblies, the seventh source comprises an eighth transistor mirror-assembled with a same ninth transistor connected to the first node and in series with the first transistor.

According to an embodiment, the device comprises a single series association of a fourth source and of a first switch and a single series association of a sixth source and of a second switch.

According to an embodiment, the device comprises a control circuit configured to turn off the first switch when the second switch is on and to turn on the first switch when the second switch is off.

According to an embodiment, the assembly or assemblies having their third switch on for each value of the digital control signal where the first switch is on determine the value of the sixth current.

A further embodiment provides a method of supplying an adjustable current by means of the described device.

A further embodiment provides an electronic circuit comprising:
a MOS power transistor;
the described device for supplying an adjustable current; and
a circuit for driving the MOS power transistor configured to draw or to supply a control current from or to the gate of the MOS power transistor according to a binary control signal, wherein the control current is determined by the adjustable current.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION OF ILLUSTRATIVE EMBODIMENTS

Figure 1:
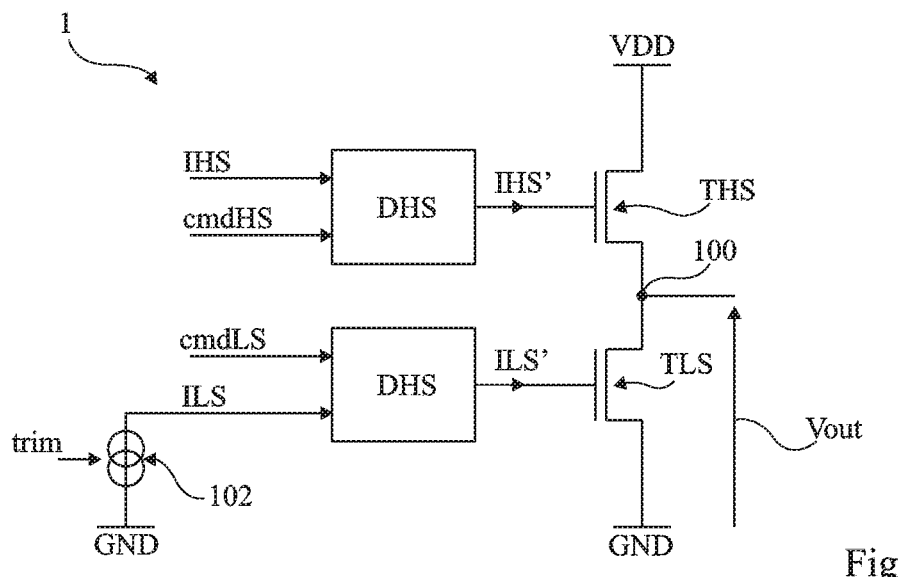
FIG. 1 shows an example of an electronic circuit to which the described embodiments apply.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, circuits having their operation depending on the value of a current that they receive have not been detailed, the described embodiments of an adjustable current supply device being compatible with such known circuits.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", and "approximately" are used herein to designate a tolerance of plus or minus 10%, preferably of plus or minus 5%, of the value in question.

FIG. 1 shows an example of a circuit 1 to which the described embodiments apply.

Circuit 1 comprises two MOS power transistors THS and TLS, here with an N channel. As an example, transistors THS and TLS are configured to conduct, between their conduction terminals (source and drain), power currents having their values in the range from 1 A, preferably 2 A, to 300 A.

Transistors THS and TLS are series-connected between a node of application of a reference potential, typically, ground GND, and a node of application of a power supply potential VDD. Transistor THS is connected to the node of application of potential VDD, transistor TLS being connected to the node of application of potential GND. An output voltage Vout of circuit 1 is available on a node 100 of connection of transistor THS to transistor TLS.

Circuit 1 comprises a circuit DHS for driving transistor THS. Circuit DHS receives a current IHS and a control signal cmdHS. Signal cmdHS is preferably a binary signal which may take two binary values '1' and '0'. Circuit DHS is configured to supply the control terminal (gate) of transistor THS with a current IHS' determined by current IHS, preferably proportional to current IHS, when signal cmdHS is at a first binary value, '1'. Circuit DHS is further configured to draw, from the control terminal of transistor THS, current IHS' when signal cmdHS is at a second binary value, for example, '0'. When current IHS' is supplied to the control terminal of transistor THS, this enables to charge the stray capacitances of transistor THS to place the potential on the control terminal of transistor THS at a high level, sufficient to turn it on. Conversely, when current IHS' is drawn from the control terminal of transistor THS, this enables to discharge the stray capacitances of transistor THS to place the potential on the control terminal of transistor THS at a low level, sufficient to turn it off.

Circuit 1 further comprises a circuit DLS for driving transistor TLS. Circuit DLS receives a current ILS and a control signal cmdLS. Signal cmdLS is preferably a binary signal capable of taking two binary values '1' and '0'. Circuit DLS is configured to supply the control terminal (gate) of transistor TLS with a current ILS' determined by current ILS, preferably proportional to current ILS, when signal cmdLS is at a first binary value, for example, '1'. Circuit DLS is further configured to draw, from the control terminal of transistor TLS, current ILS' when signal cmdHL is at the second binary value, for example, '0'. When current ILS' is supplied to the control terminal of transistor TLS, this enables to charge the stray capacitances of transistor TLS to place the potential on the control terminal of transistor TLS at a high level, sufficient to turn it on. Conversely, when current ILS' is drawn from the control terminal of transistor TLS, this enables to discharge the stray capacitances of transistor TLS to place the potential on the control terminal of transistor TLS at a low level, sufficient to turn it off.

Thus, by alternating phases where transistors THS and TLS are respectively off and on and phases where transistors THS and TLS are respectively on and off, voltage Vout respectively alternates between its low level GND and its high level VDD. Voltage Vout is for example supplied to a load, for example, a motor.

In circuit 1, the slope of voltage Vout depends on the switching speed of transistors THS and TLS, and thus on the value of respective currents IHS and ILS. It is here considered as an example that the times of rise and fall of voltage Vout should be equal to respective target values. This is a constraint on the operation of circuit 1 or, in other words, a constraint that circuit 1 should respect during its operation. The values of currents IHS and ILS are thus selected to ensure this operation.

However, due to manufacturing dispersions, for example, on the values of the stray capacitances of transistors THS and TLS, when currents IHS and ILS have the selected values, also called target values, the times of rise and fall of voltage Vout may not be those expected.

In the rest of the present disclosure, transistor TLS and its drive circuit DLS are more particularly considered, although what will be described also applies to transistor THS and to its circuit DHS and, more generally, to known circuits having their operation depending on the value of a received current.

In circuit 1, it is provided to adapt the value of current ILS with respect to its target value to obtain the expected operation of circuit 1, that is, values of rise and fall of voltage Vout which are equal to their target values, or at least as close as possible to their target values.

For this purpose, circuit 1 comprises a device 102 for supplying an adjustable current ILS or, in other words, a source 102 of an adjustable current ILS. Source 102 has a terminal connected to circuit DLS to supply it with current ILS and a terminal connected to a node of application of a potential, in this example, ground GND. Source 102 is controlled by a digital control signal trim over n bits, n being an integer greater than 1. Source 102 is then configured to supply up to $2^n$ discrete values of current ILS according to the value of signal trim. More particularly, source 102 is preferably configured to supply a discrete value of current ILS different for each value of signal trim. One of the discrete values corresponds to a target value Inom of current ILS which, in the absence of manufacturing dispersions, would lead to the expected operation of circuit 1.

In this example, pitch P between the discrete values of current ILS is constant, for example, equal to a unit current Ia. Further, in this example, value Inom of current ILS is an integer multiple of unit current Ia.

Figure 2:
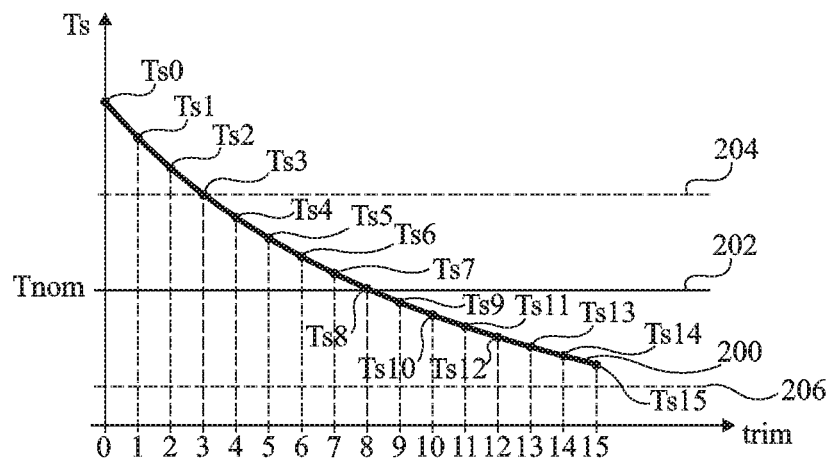
FIG. 2 is a curve illustrating an example of operation of the circuit of FIG. 1.

FIG. 2 is a curve 200 illustrating the operation of the circuit of FIG. 1. Curve 200 illustrates the variation of times Ts of rise and fall, considered herein as an example as identical, of voltage Vout according to the value of signal trim and in the absence of manufacturing dispersions.

In FIG. 2, the values of signal trim are arranged in the increasing order of the discrete values of current ILS to which they correspond. In other words, for two successive values of signal trim, the smallest of the two values corresponds to a first discrete value of current ILS and the largest of the two values of signal trim corresponds to a second discrete value of current ILS, equal to the first discrete value plus pitch P.

In the example of FIG. 2, signal trim is over n=4 bits and can thus take 16 values ranging from 0 to 15. Value 8 of signal trim corresponds to the discrete target value Inom of current ILS for which time Ts is equal to target value Tnom. Target value Tnom of time Ts is materialized by a horizontal full line 202 in FIG. 2. Values 0, 1, 2, 3, 4, 5, 6, 7, 9, 10, 11, 12, 13, 14, and 15 of signal trim then correspond to discrete values of current ILS respectively equal to Inom−8*P, Inom−7*P, Inom−6*P, Inom−5*P, Inom−4*P, Inom−3*P, Inom−2*P, Inom−P, Inom+P, Inom+2*P, Inom+3*P, Inom+4*P, Inom+5*P, Inom+6*P, and Inom+7*P.

It can be observed that the higher current ILS, the shorter time Ts. This results from the fact that, in circuit 1, the higher current ILS is, the shorter the time of charge or discharge of the stray capacitances of transistor TLS, and thus the shorter the switching time of transistor TLS, and thus the shorter time Ts, are.

Figure 3:
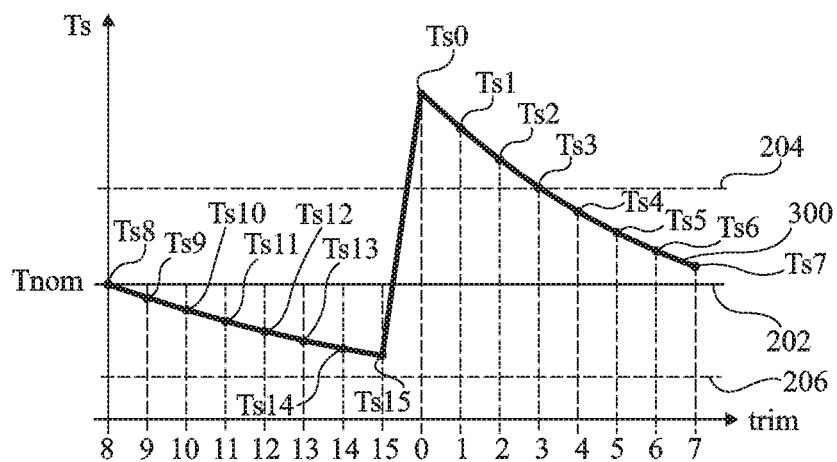
FIG. 3 is a curve obtained from the curve of FIG. 2.

FIG. 3 is a current 300 obtained from the curve of FIG. 2. More particularly, current 300 corresponds to curve 200 in the case where, as compared with FIG. 2, the values of signal trim have been re-ordered, successive values 0 to 7 being arranged on the axis of abscissas after successive values 8 to 15.

In FIGS. 2 and 3, in addition to line 202, horizontal dotted lines 204 and 206 represent the values of time Ts for dispersions with respect to nominal discrete value Tnom (value 8 of signal trim) respectively of 6*σ and of −6*σ, where σ is the standard deviation of the Gaussian distribution of the Ts obtained when circuit 1 is manufactured and there are manufacturing dispersions.

The principle of the adaptation of the discrete value of current ILS according to the manufacturing dispersions of circuit 1 is for example the following.

In the manufactured circuit 1, when signal trim is at value 8, if time Ts has the respective value Ts0, Ts1, Ts2, Ts3, Ts4, Ts5, Ts6, Ts9, Ts10, Ts11, Ts12, Ts13, Ts14, or Ts15 corresponding to the value that time Ts would have in the absence of manufacturing dispersions for respective values 0, 1, 2, 3, 4, 5, 6, 7, 9, 10, 11, 12, 13, 14, or 15 of signal trim, signal trim is set to respective value 15, 14, 13, 12, 11, 10, 9, 7, 6, 5, 4, 3, 2, 1, or 0, so that time Ts in the manufactured circuit 1 is at a value equal to target value Tnom, or at least as close as possible to target value Tnom.

However, in practice, such a way of adapting the value of current ILS does not provide the expected results. In particular, certain values of signal trim, and thus certain corresponding discrete values of current ILS, are not usable to adapt current ILS, so that after the adaptation of the value of current ILS, time Ts is equal to target value Tnom, or at least as close as possible to target value Tnom. In the example described in relation with FIGS. 1, 2, and 3, values 0, 1, and 2 of signal trim are not usable to adapt current ILS so that time Ts is as close as possible to its target value Tnom.

A similar problem is posed in many circuits where the value of a parameter, which is desired to be equal to a target value, or at least as close as possible to the target value, does not vary linearly with the value of the current received by the circuit across the entire range of discrete values that an adjustable current source can supply thereto. In other words, this issue arises when the considered parameter varies differently with the current that it receives according to the range of values of the current.

To overcome this issue, the inventor here provides a device for supplying an adjustable current taking a plurality of discrete values, where a different pitch separates the discrete values according to the current range to which the discrete values belong.

Further, preferably, the inventor provides for at least one current range, preferably each current range, to comprise at least three discrete current values to avoid making the device more complex. Indeed, a device for supplying an adjustable current where the difference between two successive values would be different may be provided, but this would lead to a device more complex to form than that provided by the inventor.

Preferably, it is provided for each of the different pitches to be an integer multiple of a unit current Ia, the discrete target value Inom of the supplied current being preferably an integer multiple of current Ia. Further, preferably, it is provided for the pitches to be integer multiples of the smallest pitch used.

Figure 4:
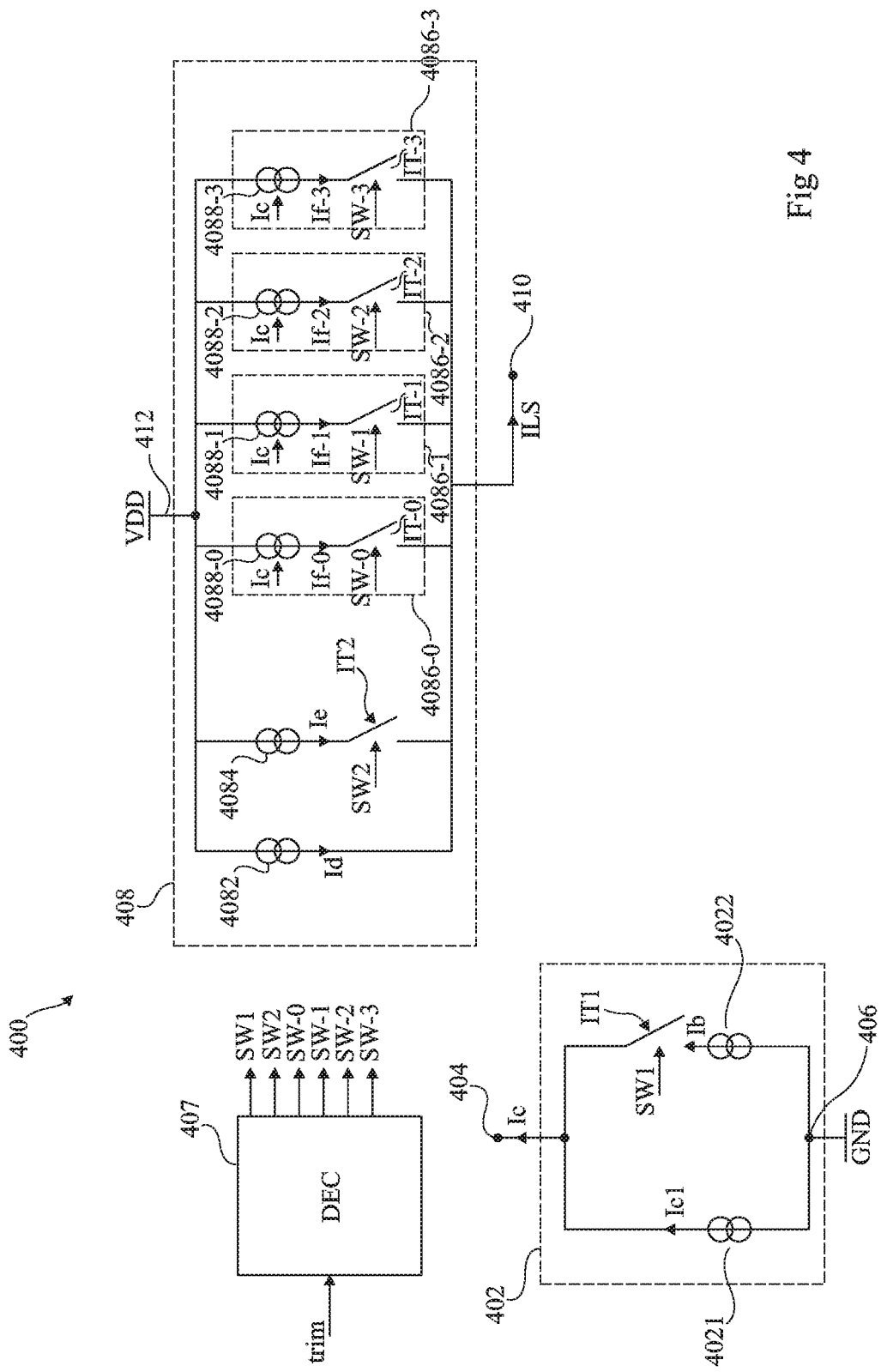
FIG. 4 shows an embodiment of an adjustable current supply device.

FIG. 4 illustrates an embodiment of an adjustable current supply device 400.

In this embodiment, device 400 is configured to replace source 102 of circuit 1 and to supply current ILS. In this embodiment, it is provided for device 400 to supply discrete values of current ILS with two different pitches P1 and P2 according to the considered range of current ILS, and more particularly pitch P2 in the current range smaller than discrete target value Inom, and pitch P1 smaller than pitch P2 in the current range greater than discrete target value Inom. It is here considered as an example that pitch P1 is equal to unit current Ia, pitch P2 is equal to twice unit current Ia, and discrete target value Inom is equal to 58 times current Ia.

Device 400 comprises a current source 402. Source 402 is connected between a node 404 and a node 406 of application of a potential, for example, of reference potential GND. Source 402 is configured to supply a current Ic to node 404. Preferably, source 402 is configured to supply, according to the value of signal trim, a plurality of discrete values of current Ic, and more particularly a different value for each different pitch. Preferably, each different pitch is equal to A*Ic when current Ic is at the discrete value corresponding to this pitch, with A being a coefficient of proportionality between the discrete values of current Ic and the respective pitches corresponding to these discrete values of current Ic.

In this example, source 402 is configured to supply, according to the value of signal trim, a current Ic at a first value Ic1 determined by the value of pitch P1, or at a second value Ic2 determined by the value of pitch P2, pitches P1 and P2 being preferably respectively equal to A*Ic1 and A*Ic2. In this example, A is equal to 1, whereby value Ic1 is equal to pitch P1, second value Ic2 being equal to pitch P2.

According to an embodiment, source 402 comprises a current source 4021 configured to supply a current equal to value Ic1 to node 404, source 402 further comprising a current source 4022 coupled to node 404 by a switch IT1. Switch IT1 is controlled by a signal SW1 determined by the value of signal trim. Source 4022 is configured to supply a current Ib such that, when switch IT1 is on, current Ic is equal to Ic2. In other words, Ib is equal to Ic2−Ic1.

In this example where source 402 is connected between nodes 404 and 406, source 4021 is connected between these same nodes 404 and 406, and so is the series association of source 4022 and of switch IT1.

Device 400 further comprises a current source 408 configured to supply, to a node 410, the discrete values of current ILS from values Ic1 and Ic2 of current Ic and the value of signal trim. In this example, source 408 is connected between node 410 and a node 412 of application of potential VDD.

Source 408 is configured to supply current ILS at the discrete target value Inom to or from which is added or subtracted an integer multiple of current A*Ic, and thus of pitch P1 or P2 according to the value of signal trim, the value of the integer multiple being determined by the value of signal trim. Thus, when current Ic is equal to Ic1, source 408 supplies discrete values of current ILS at pitch P1 and, when current Ic is equal to Ic2, source 408 supplies discrete values of current ILS at pitch P2.

Device 400 comprises a control circuit, or decoder (DEC), 407 configured to supply signal SW1 for controlling switch IT1 from signal trim.

In this example, control circuit 407 is configured to control switch IT1 to the on state for values of signal trim corresponding to discrete values of current ILS separated from one another by pitch P2, current Ic then being equal to Ic2. Circuit 407 is further configured to control switch IT1 to the off state for values of signal trim corresponding to discrete values of the current separated from one another by the pitch equal to P1, current Ic then being equal to Ic1.

According to an embodiment, source 408 comprises a current source 4082 connected to node 410. In this example where source 408 is connected between nodes 410 and 412, source 4082 is also connected between nodes 410 and 412.

Source 4082 is configured to supply a constant base current Id to node 610. Preferably, current Id is an integer multiple of unit current Ia. In this example where value Inom is equal to 58*Ia, base current Id is equal to 42*Ia.

According to this embodiment, source 408 further comprises a current source 4084 coupled to node 410 by a switch IT2. Switch IT2 is controlled by a signal SW2 determined by the value of signal trim. In this example where source 408 is connected between nodes 410 and 412, the series association of source 4084 and of switch IT2 is connected between these same nodes 410 and 412.

Source 4084 is configured to supply a compensation current Ie. When switch IT2 is on, current Ie is transmitted to node 410, and adds to current Id. Preferably, compensation current Ie is an integer multiple of unit current Ia. In this example, compensation current Ie is equal to 8*Ia.

Circuit 407 is configured to supply signal SW2 from signal trim. More particularly, circuit 407 is configured to control the switch IT2 to the off state when switch IT1 is on, and switch IT2 to the on state when switch IT1 is off.

According to this embodiment, source 408 comprises n, for example, 4, assemblies 4086-$i$, i being an integer in the range from 0 to n−1 (4086-0, 4086-1, 4086-2, 4086-3). Each assembly comprises a current source 4088-$i$ (4088-0, 4088-1, 4088-2, 4088-3) series-connected with a switch IT-i (IT-0, IT-1, IT-2, IT-3) between nodes 412 and 410. In this example, the switches are connected to node 410.

Each switch IT-i is controlled by a signal SW-i (SW-0, SW-1, SW-2, SW-3) determined by the value of signal trim. Circuit 407 is configured to supply control signals SW-i from signal trim.

Each current source 4088-$i$ is configured to supply a different current If-i (If-0, If-1, If-2, If-3). More particularly, each current source 4088-$i$ is configured to supply a current If-i which is an integer multiple of current Ic. In this embodiment, each current source 4088-$i$ is configured to supply a current If-i equal to $2^i$*A*Ic, that is, to $2^i$*Ic in this example where A is equal to 1. In other words, each current source 4088-$i$ is configured to supply a current If-i equal to $2^i$*P1 or to $2^i$*P2 according to whether current Ic is respectively equal to Ic1 or to Ic2.

Thus, the assembly of associations 4086-$i$ is capable of supplying node 410 with a current equal to k*A*Ic, k being an integer in the range from 0 to $2^{n-1}$, the value of k being determined by the combination of off/on states of switches IT-i, and thus by the value of signal trim. In this example, the value of k is equal to the value of signal trim.

In operation, when signal trim is at the value corresponding to the discrete target value Inom of current ILS, in this example, value 8 of signal trim, circuit 407 maintains switch IT1 off and switch IT2 on. As a result, currents Id and Ie add on node 410, and source 402 supplies a current Ic equal to Ic1 to node 404. Further, circuit 407 controls switches IT-i so that the sum of currents If-i supplied to node 410 is equal to Inom−(Id+Ie) or, in other words, so that current ILS on node 210 is at its target value Inom. In this example, only switch IT-3 is on, switches IT-0, IT-1, and IT-2 being left off, whereby current If-3, equal to 8*Ic1, and thus to 8*Ia in this example, adds to currents Id and Ie on node 410.

When signal trim is at a value corresponding to a discrete value of current ILS in the current range where the pitch is equal to P1, circuit 407 maintains switches IT1 and IT2 respectively off and on, so that current Ic is equal to Ic1. Circuit 407 further controls switches IT-i according to the value of signal trim.

For example, when signal trim is at value 6, switches IT-0, IT-1, IT-2, and IT-3 are respectively off, on, on and off, the sum of the currents If-i supplied to node 410 then being equal to 6*Ic1, and thus to 6*P1, that is, to 6*Ia in this example. As a result, current ILS then is at discrete value Id+Ie+6*P1, that is, equal to 56*Ia in this example or, in other words, to Inom minus twice pitch P1.

When signal trim is at a value corresponding to a discrete value of current ILS in the current range where the pitch is equal to P2, circuit 407 maintains switches IT1 and IT2 respectively on and off, so that current Ic is equal to Ic2. Circuit 407 further controls switches IT-i according to the value of signal trim.

For example, when signal trim is at value 11, switches IT-0, IT-1, IT-2, and IT-3 are respectively on, on, off, and on, the sum of the currents If-i supplied to node 410 being then equal to 11*Ic2, and thus to 11*P2, that is, to 22*Ia in this example. As a result, current ILS then is at discrete value Id+11*P2, that is, equal to 64*Ia in this example or, in other words, to Inom plus three times pitch P2.

It can be understood from the above description that compensation current Ie is selected to compensate an additional current introduced on node 210 when current Ic switches from value Ic1 to value Ic2 or, in other words, when the pitch switches from P1 to P2. In other words, compensation current Ie is determined by the association(s) 4084-i having their switch IT-i on over the entire current range corresponding to pitch P2, that is, over the entire current range where current IT1 is on.

In this example, the two current ranges corresponding to the two respective pitches P1 and P2 are separated from each other by the discrete value Inom corresponding to value 8 of signal trim. More particularly, when signal trim is at value knom=8, the sum of the currents If-i supplied to node 410 is equal to knom*A*Ic, Ic being at value Ic1 and A being equal to 1 in this example. Compensation current Ie is selected to be equal to knom*(P2−P1), and thus to 8*Ia in this example. In operation, over the entire range of current values smaller than Inom, switch IT-3 is on. As a result, the passing from pitch P1 to P2 results in that an additional current equal to $2^{3}$*(P2−P1), that is, 8*Ia in this example, is present on node 210. However, since the switching from pitch P1 to pitch P2 also causes the turning off of switch IT2, current Ie, equal to knom*(P2−P1), that is, 8*Ia in this example, is no longer present on node 210 and compensates for the supply of the additional current to node 210.

Figure 5:
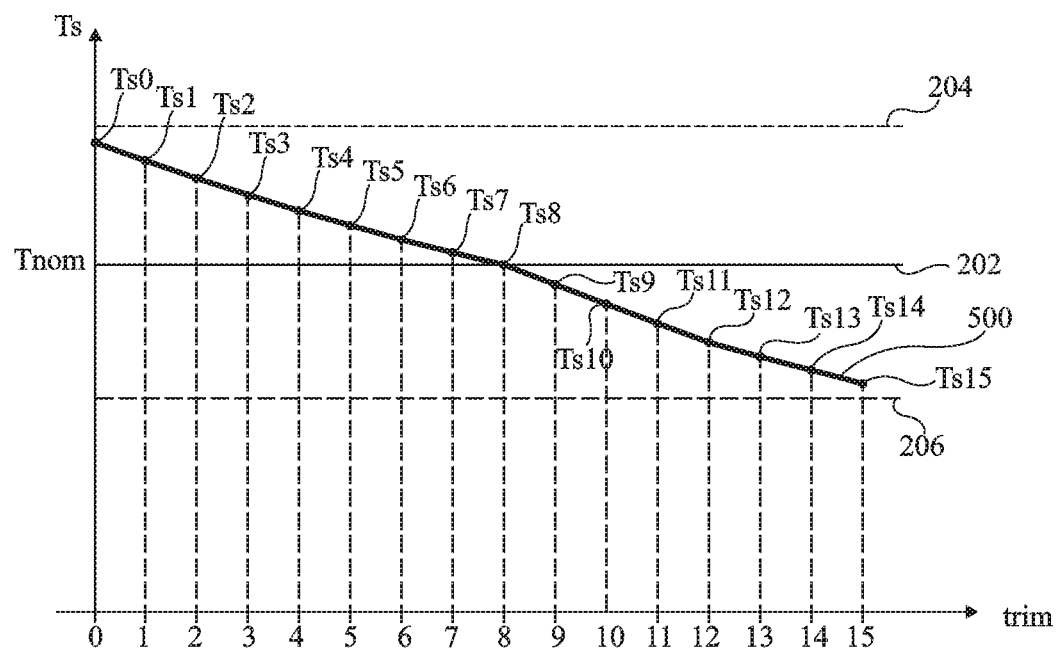
FIG. 5 is a curve illustrating the operation of the circuit of FIG. 1 with the device of FIG. 4.

FIG. 5 is a curve 500 illustrating the operation of circuit 1 where source 102 has been replaced with device 400 of FIG. 4. Curve 500 more particularly illustrates the variation of times Ts of rise and fall, here considered as an example as being identical, of voltage Vout according to the value of signal trim, in the absence of manufacturing dispersions, the values of signal trim being here arranged in the same order as in FIG. 2.

Figure 6:
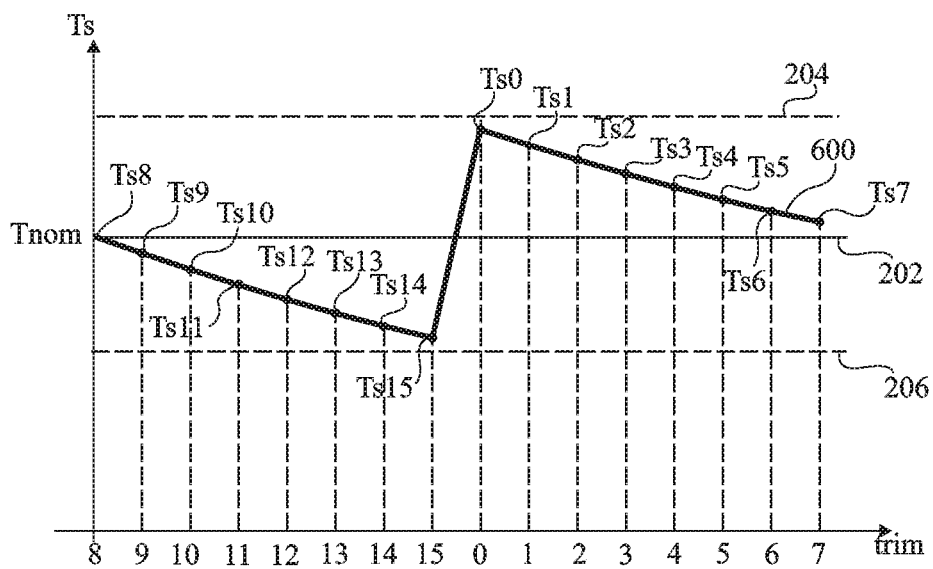
FIG. 6 is a curve obtained from the curve of FIG. 5.

FIG. 6 is a curve 600 obtained from curve 500 of FIG. 5, by reordering the values of signal trim in the same way as in FIG. 3.

In this example, as in FIGS. 2 and 3, it is considered as an example that signal trim is over n=4 bits and that device 400 is configured to supply 16 discrete values of current ILS, with a discrete target value Inom of current ILS corresponding to value 8 of signal trim.

Conversely to what has been described in relation with FIGS. 2 and 3, in this embodiment, the discrete values of current ILS are separated from one another by pitch P2 in the range of current smaller than discrete target value Inom and by pitch P1 in the range of current greater than discrete target value Inom.

Further, in this example, pitches P1 and P2 are respectively equal to A*Ic1 and A*Ic2, with A equal to 1 and currents Ic1 and Ic2 respectively equal to Ia and to 2*Ia.

It can be observed on curves 500 and 600 that, in the current range smaller than Inom (values 0 to 7 of signal trim), values Ts0, Ts1, Ts2, Ts3, Ts4, Ts5, Ts5, and Ts6 are smaller than those of curve 200 of FIG. 2. These values are here all in the range from discrete target value Tnom to a value Tnom+6*σ (horizontal dotted line 204), which was not true in FIGS. 2 and 3.

It can also be observed that, conversely to curve 200 of FIG. 2, curve 500 is substantially symmetrical with respect to the intersection of curve 500 with line 202 corresponding to value Inom. It can more particularly be observed that the variation of time Ts with the value of signal trim is more linear in FIG. 5 than in FIG. 2.

Thus, each value of signal trim may be used to adapt the value of current ILS so that time Ts is equal to discrete target value Tnom or at least as close as possible to discrete target value Tnom, which was not true on use of source 102 with a single constant pitch P.

Figure 7:
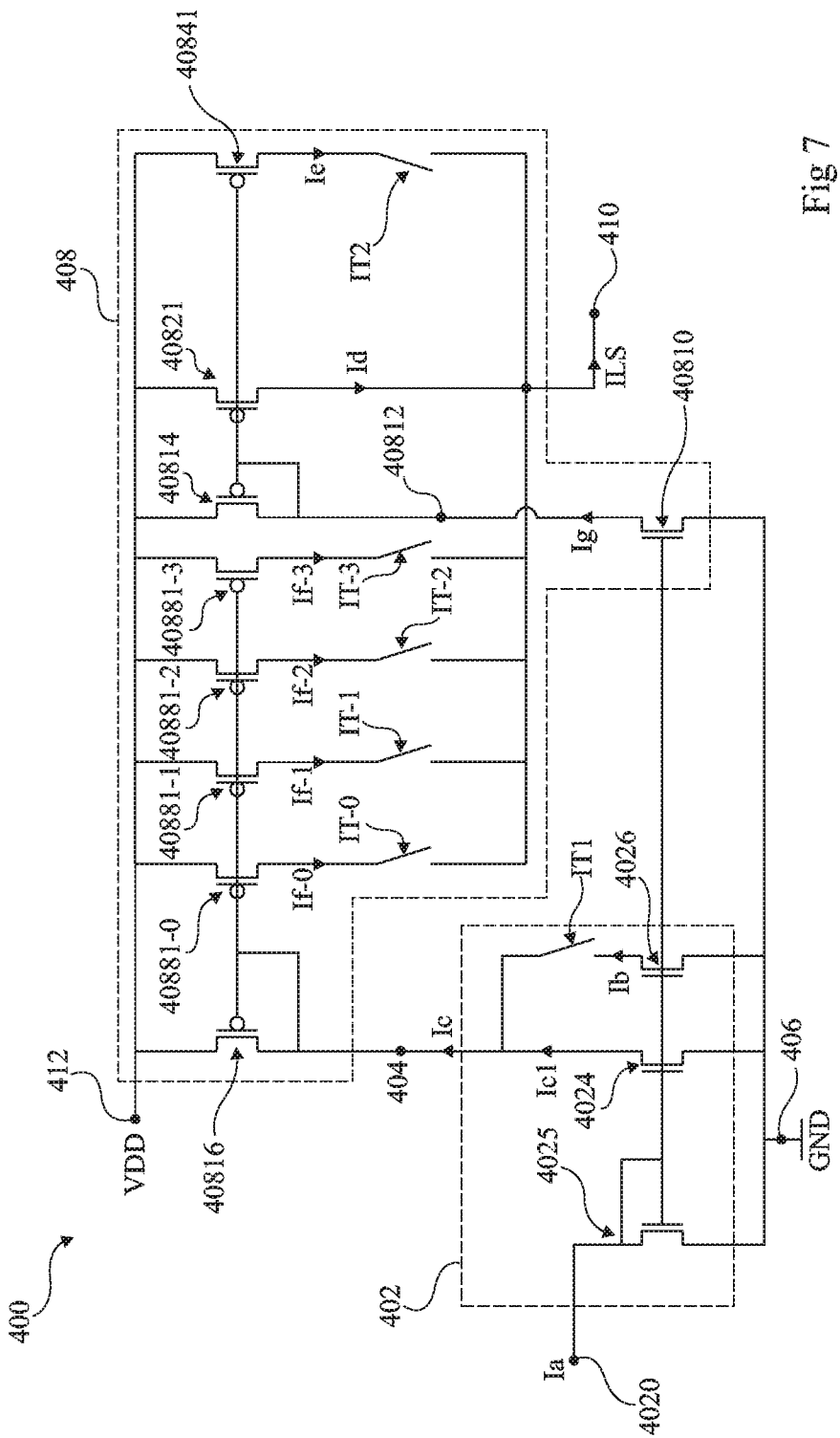
FIG. 7 shows in more detailed fashion an embodiment of the device of FIG. 4.

FIG. 7 shows in more detailed fashion an embodiment of the device of FIG. 4. In FIG. 7, circuit 407 and the control that it supplies are not shown.

In this embodiment, source 402 receives, on a node 4020, unit current Ia. Source 402 comprises a transistor 4025, here a MOS transistor, for example, having an N channel. Transistor 4025 is connected between nodes 4020 and 406. Transistor 4025 is diode-assembled. In this example, the drain of transistor 4025 is connected to node 4020.

In this embodiment, source 4021 (FIG. 4) comprises a transistor 4024, here a MOS transistor, for example, having an N channel, mirror-assembled with transistor 4025. Transistor 4024 is connected between nodes 406 and 404. The gate of transistor 4024 is connected between nodes 406 and 404. The gate of transistor 4024 is connected to the gate of transistor 4025. The dimension ratio between transistors 4025 and 4024 is determined by the ratio between currents Ic1 and Ia. Current Ic1 is supplied by transistor 4024 to node 404. In this example, current Ic1 is equal to current Ia.

In this embodiment, source 4022 (FIG. 4) comprises a transistor 4026, here, a MOS transistor, for example, having an N channel, mirror-assembled with transistor 4025. The gate of transistor 4026 is connected to the gate of transistor 4025. Transistor 4026 is in series with switch IT1, between nodes 404 and 406. In this example, switch IT1 is connected to node 404. When switch IT1 is on, transistor 4024 is configured to supply current Ib to node 404. The dimension ratio between transistors 4025 and 4026 is determined by the ratio between currents Ic2 and Ia. In this example where current Ic2 is equal to 2*Ia, current Ib is equal to current Ia.

In this embodiment, source 408 comprises a transistor 40810, here, a MOS transistor, for example, having an N channel, connected between node 406 and an internal node 40812 of source 408. Transistor 40810 is mirror-assembled with transistor 4025 of source 402, so that it supplies node 40812 with a current Ig proportional to current Ia, for example, equal to an integer multiple of current Ia, preferably equal to Ia. In this example, the source of transistor 40810 is connected to node 406, its drain being connected to node 40812. Source 408 further comprises a transistor 40814, here, a MOS transistor, for example, having a P channel, connected between nodes 40812 and 412. Transistor 40814 is diode-assembled. In this example, the drain of transistor 40814 is connected to node 40812.

In this embodiment, source 4082 (FIG. 4) of source 408 comprises a transistor 40821, here a MOS transistor, for example, having a P channel, connected between nodes 412 and 410. Transistor 40821 is mirror-assembled with transistor 40814. Transistor 40821 is configured to supply, from current Ig, current Id to node 410. The dimension ratios between transistors 40821 and 4025, and the dimension ratios between transistors 40821 and 40814 are determined by the ratio of current Id to current Ia.

In this embodiment, source 4084 (FIG. 4) of source 408 comprises a transistor 40841, here, a MOS transistor, for example, with a P channel, series-connected with switch IT2 between nodes 412 and 410, switch IT2 being for example connected to node 410. Transistor 40841 is mirror-assembled with transistor 40814. Transistor 40841 is configured to supply, from current Ig, current Ie to node 410 when switch IT2 is on. The dimension ratios between transistors 4082I and 4025 and the dimension ratios between transistors 40841 and 40814 are determined by the ratio of current Ie to current Ia.

In this embodiment, current source 408 further comprises a transistor 40816, here, a MOS transistor, for example, having a P channel, connected between nodes 404 and 412. Transistor 40816 is diode-assembled. In this example, the drain of transistor 40816 is connected to node 404.

In this embodiment, each current source 4088-i (reference numeral 4088-0, 4088-1, 4088-2, and 4088-3 in FIG. 4), comprises a transistor 40881-i (40881-0, 40881-1, 40881-2, 40881-3), here, a MOS transistor, for example, having a P channel, mirror-assembled with transistor 40816. Each transistor 40881-i (40881-0, 40881-1, 40881-2, 40881-3) is series-connected with the corresponding switch IT-i (IT-0, IT-1, IT-2, IT-3), between nodes 412 and 410, switch IT-i being connected to node 410 in this example. Each transistor 40881-i is configured to supply the corresponding current If-i (If-0, If-1, If-2, If-3) to node 410 when the corresponding switch IT-i is on.

The dimension ratios between transistor 40816 and each transistor 40881-i are determined by the ratio of current Ic to each current If-i.

The embodiment of device 400 described in relation with FIG. 7 is particularly simple to implement, particularly due to the fact that all the currents implemented in this device are obtained from a same unit current Ia. Further, due to the fact the all the current implemented in device 400 are obtained from a same current Ia, this enables to decrease the impact of manufacturing dispersions on the operation of device 400. This also enables to adapt the value of current Ia, for example, when the times of rise and fall of voltage Vout of circuit 1 are not identical, for example, by providing a first value of current Ia when voltage Vout is switched to its high level, and a second value of current Ia when voltage Vout is switched to its low level.

According to a specific embodiment, not illustrated, switch IT1 is formed by a MOS transistor, for example, having an N channel, switches IT2 and IT-i being each formed by a MOS transistor, for example, having a P channel. In the specific example where pitch P1 corresponds to the current range greater than discrete target value Inom, pitch P2 corresponds to the current range smaller than value Inom, and where each binary code of signal trim codes the digital value corresponding to this binary code (for example, code "1011" of signal trim corresponds to value 11 of this signal), circuit 407 is particularly simple to implement. Indeed, in this specific example, calling b3, b2, b1, and b0 the bits of signal trim arranged from the most significant bit to the least significant bit:

switch IT1 is off when the most significant bit b3 of signal trim is at '1' (values 8, 9, 10, 11, 12, 13, 14, and 15 of signal trim), and on otherwise;

switch IT2 is on when the most significant bit b3 of signal trim is at '1', and off otherwise; and switch IT-3, respectively IT-2, respectively IT-1, respectively IT-0 is on when bit b3, respectively b2, respectively b1, respectively b0 is at '1', and off otherwise.

Embodiments where, as an example, device 400 is configured to deliver discrete values with two pitches P1 and P2 corresponding to two different current ranges, target value Inom of the current marking the passing from one current range to the other, have been described in relation with FIGS. 4 to 7. It will be within the abilities of those skilled in the art, based on the functional indications given hereinabove, to provide for another discrete value than the target value of the current to mark the passing from one current range to another, for example, by adapting the control of switches IT1 and IT2 and the values of currents Id and Ie.

More generally, it will be within the abilities of those skilled in the art, based on these functional indications, to provide more than two different pitches, each corresponding to different current ranges. Source 402 is then for example configured to supply, for each different current range, a current Ic at a different value determined by the value of the pitch in this range. Further, source 408 is then for example configured to supply a plurality of different compensation currents to compensate for the supply of an additional current on node 410 on passing from one pitch to another.

Although embodiments with n=4 have been described, it will be within the abilities of those skilled in the art to implement device 400 whatever the value of n greater than 1, preferably than 2, or even more preferably greater than 3.

Although embodiments with A=1 have been described, it will be within the abilities of those skilled in the art, based on the above functional indications, to implement device 400 for other values of factor A, for example, by adapting the dimension ratios in the current mirrors of device 400 of FIG. 7.

Finally, it will be within the abilities of those skilled in the art to implement device 400 in other circuits than circuit 1 (FIG. 1).

Various embodiments and variations have been described. It will be understood by those skilled in the art that certain features of these various embodiments and variations may be combined, and other variations will occur to those skilled in the art.

Finally, the practical implementation of the described embodiments and variations is within the abilities of those skilled in the art based on the functional indications given hereinabove. In particular, based on these functional indications, it will be within the abilities of those skilled in the art to select the number of pitches between the discrete values of the current supplied by device 400, and/or the value of these pitches, according to the targeted application, that is, according to the electronic circuit where device 400 is implemented.

What is claimed is:

1. A device comprising:
  a first source of a first current at a first node, the first source configured to supply a different value of the first current for each of different current ranges; and
  a second current source configured to supply, to a second node, at least from the first current and a digital control signal, discrete values of an adjustable current belonging to different current ranges, with a pitch between two successive discrete values determined by that of the current ranges to which each of the two successive discrete values belongs.

2. The device of claim 1, wherein the pitch separating the two successive discrete values is different for each of the current ranges.

3. The device of claim 1, wherein at least one of the current ranges comprises at least three of the discrete values.

4. The device of claim 1, wherein a value of the pitch is determined by the value of the first current.

5. The device of claim 1, wherein the first source comprises:
  a third source of a second current connected to the first node; and
  at least one series association of a fourth source of a third current and of a first switch having its off or on state determined by the digital control signal, the fourth source being configured to supply the third current to the first node when the first switch is on.

6. The device of claim 5, wherein:
the third source is a first current mirror comprising a first transistor connected to the first node and mirror-assembled with a second transistor; and
the fourth source is a second current mirror comprising a third transistor coupled to the first node and mirror-assembled with the second transistor.

7. The device of claim 5, wherein the second current source comprises:
a fifth source of a fourth current configured to supply the fourth current to the second node;
at least one series association of a second switch having its off or on state determined by the digital control signal and of a sixth source of a fifth current configured to supply the fifth current to the second node when the second switch is on; and
a plurality of assemblies, each comprising a seventh source of a sixth current in series with a third switch, each assembly being configured to supply the sixth current to the second node when the second switch is on, the sixth current being different for each assembly and the off or on state of each third switch being determined by the digital control signal.

8. The device of claim 7, wherein:
the third source is a first current mirror comprising a first transistor connected to the first node and mirror-assembled with a second transistor;
the fourth source is a second current mirror comprising a third transistor coupled to the first node and mirror-assembled with the second transistor;
the fifth source comprises a fourth transistor mirror-assembled with the second transistor and a third current mirror comprising a fifth transistor connected to the second node and mirror-assembled with a sixth transistor in series with the fourth transistor; and
the sixth source comprises a seventh transistor mirror-assembled with the sixth transistor and in series with the second switch.

9. The device of claim 8, wherein, in each of the assemblies, the seventh source comprises an eighth transistor mirror-assembled with a same ninth transistor connected to the first node and in series with the first transistor.

10. The device of claim 7, comprising a single series association of the fourth source and the first switch and a single series association of the sixth source and the second switch.

11. The device of claim 10, comprising a control circuit configured to turn off the first switch when the second switch is on and to turn on the first switch when the second switch is off.

12. The device of claim 11, wherein each assembly having the third switch on for each value of the digital control signal where the first switch is on determine the value of the sixth current.

13. A method of supplying an adjustable current, the method comprising:
supplying discrete values of the adjustable current belonging to different current ranges, with a pitch between two successive discrete values determined by that of the current ranges to which each of the two successive discrete values belongs.

14. The method of claim 13, wherein the pitch separating the two successive discrete values is different for each of the current ranges.

15. The method of claim 13, wherein at least one of the current ranges comprises at least three of the discrete values.

16. The method of claim 13, comprising:
supplying, by a first source of a first current at a first node, a different value of the first current for each of the current ranges; and
supplying, by a second current source, at least from the first current and a digital control signal, the discrete values of the adjustable current to a second node.

17. The method of claim 16, further comprising determining a value of the pitch by the value of the first current.

18. An electronic circuit comprising:
a MOS power transistor;
a device configured to supply discrete values of an adjustable current belonging to different current ranges, with a pitch between two successive discrete values determined by that of the current ranges to which each of the two successive discrete values belongs; and
a circuit for driving the MOS power transistor configured to draw or to supply a control current from or to a gate of the MOS power transistor according to a binary control signal,
wherein the control current is determined by the adjustable current.

19. The electronic circuit of claim 18, comprising:
a first source of a first current at a first node, configured to supply a different value of the first current for each of the current ranges; and
a second current source configured to supply, at least from the first current and a digital control signal, the discrete values of the adjustable current to a second node.

20. The electronic circuit of claim 19, wherein the first source comprises:
a third source of a second current connected to the first node; and
at least one series association of a fourth source of a third current and of a first switch having its off or on state determined by the digital control signal, the fourth source being configured to supply the third current to the first node when the first switch is on.

* * * * *